(12) United States Patent
Kim et al.

(10) Patent No.: US 9,035,347 B2
(45) Date of Patent: May 19, 2015

(54) ORGANIC LIGHT-EMITTING DISPLAY APPARATUS AND METHOD OF MANUFACTURING THE SAME

(71) Applicant: Samsung Display Co., Ltd., Yongin-si, Gyeonggi-do (KR)

(72) Inventors: Sang-Yeol Kim, Yongin (KR); Il-Seok Park, Yongin (KR); Kyul Han, Yongin (KR)

(73) Assignee: Samsung Display Co., Ltd. (KR)

(*) Notice: Subject to any disclaimer, the term of this patent is extended or adjusted under 35 U.S.C. 154(b) by 0 days.

(21) Appl. No.: 14/191,784

(22) Filed: Feb. 27, 2014

(65) Prior Publication Data

US 2014/0175417 A1   Jun. 26, 2014

Related U.S. Application Data

(62) Division of application No. 13/443,767, filed on Apr. 10, 2012, now Pat. No. 8,697,468.

(30) Foreign Application Priority Data

Jul. 12, 2011 (KR) .................. 10-2011-0068964

(51) Int. Cl.
*H01L 51/52* (2006.01)
*H01L 51/50* (2006.01)
*H01L 27/32* (2006.01)

(52) U.S. Cl.
CPC ........ *H01L 51/5203* (2013.01); *H01L 51/5092* (2013.01); *H01L 27/3246* (2013.01)

(58) Field of Classification Search
CPC ............ H01L 51/5203; H01L 51/5092; H01L 27/3246
See application file for complete search history.

(56) References Cited

U.S. PATENT DOCUMENTS

| | | | |
|---|---|---|---|
| 7,696,682 B2 | 4/2010 | Kim et al. | |
| 7,981,484 B2 | 7/2011 | Kumagai | |
| 2006/0082289 A1 | 4/2006 | Yeh et al. | |
| 2006/0135069 A1 | 6/2006 | Bune | |
| 2006/0223221 A1 | 10/2006 | Ishii | |
| 2008/0311427 A1 | 12/2008 | Shin et al. | |
| 2008/0315761 A1 | 12/2008 | Kobayashi | |

FOREIGN PATENT DOCUMENTS

| | | |
|---|---|---|
| KR | 10-2000-0027755 | 5/2000 |
| KR | 10-2006-0069261 | 6/2006 |
| KR | 10-2006-0105495 | 10/2006 |
| KR | 10-2007-0000262 | 1/2007 |
| KR | 10-2007-0036700 | 4/2007 |
| KR | 10-2008-0109547 | 12/2008 |

*Primary Examiner* — Long Pham
(74) *Attorney, Agent, or Firm* — Knobbe Martens Olson & Bear LLP

(57) ABSTRACT

An organic light-emitting apparatus includes a substrate; a first electrode formed on the substrate, where the first electrode is a cathode, an electron injection layer formed to contact an upper surface of the first electrode and including Mg, an intermediate layer formed on the electron injection layer and including an organic emission layer, and a second electrode which is formed on the intermediate layer and is an anode.

5 Claims, 5 Drawing Sheets

ORGANIC LIGHT-EMITTING DISPLAY APPARATUS AND METHOD OF MANUFACTURING THE SAME

CROSS-REFERENCE TO RELATED APPLICATIONS

This application claims priority to U.S. patent application Ser. No. 13/443,767, filed on Apr. 10, 2012, titled "Organic Light-Emitting Display Apparatus And Method Of Manufacturing The Same", which claims the benefit of Korean Patent Application No. 10-2011-0068964, filed on Jul. 12, 2011, the disclosures of which are hereby incorporated herein by reference in their entireties.

BACKGROUND

1. Field

The present disclosure relates to an organic light-emitting apparatus for improving image quality and a method of manufacturing the same.

2. Description of the Related Technology

Recently, display apparatuses have been replaced with thin-film type flat panel display apparatuses that are portable. From among thin-film type flat panel display apparatuses, an organic light-emitting display apparatus is a self-emitting display apparatus, has a larger viewing angle, better contrast characteristics, and a faster response rate, and thus has drawn attention as a next-generation display device.

An organic light-emitting display apparatus includes a first electrode, a second electrode, and an intermediate layer. The intermediate layer includes an organic emission layer. When voltage is applied to the first electrode and the second electrode, the organic emission layer emits visible light.

However, an optical efficiency of the organic emission layer is limited, and thus improving image quality of the organic light-emitting display apparatus is limited.

SUMMARY OF CERTAIN INVENTIVE ASPECTS

Embodiments provide an organic light-emitting apparatus for improving image quality and a method of manufacturing the same.

According to one aspect, there is provided an organic light-emitting apparatus including: a substrate; a first electrode which is formed on the substrate and is a cathode; an electron injection layer formed to contact an upper surface of the first electrode and including Mg; an intermediate layer formed on the electron injection layer and including an organic emission layer; and a second electrode which is formed on the intermediate layer and is an anode.

A contact angle between the electron injection layer and the first electrode can be in the range of 10° to 70°.

The first electrode can include indium tin oxide (ITO).

The organic light-emitting apparatus can further include a pixel defining layer disposed on the first electrode and including an opening, wherein the electron injection layer and the first electrode each other contact in the opening.

The electron injection layer can be disposed in the opening so as not to deviate from the opening.

The pixel defining layer can include a polymer material.

According to another aspect, there is provided a method of manufacturing an organic light-emitting apparatus, the method including: forming a first electrode, which is a cathode, on a substrate; forming an electron injection layer including Mg so as to contact an upper surface of the first electrode; forming an intermediate layer including an organic emission layer on the electron injection layer; and forming a second electrode, which is an anode, on the intermediate layer.

The forming of the electron injection layer can be performed in such a way that a contact angle between the electron injection layer and the first electrode is in the range of 10° to 70°.

Plasma treatment can be performed between the forming of the first electrode and the forming of the electron injection layer.

The plasma treatment can be performed using nitrogen or oxygen.

The plasma treatment can be performed under a pressure of 30 mmTorr to 100 mmTorr and a power atmosphere of 200 W to 1000 W.

The plasma treatment can be performed for 30 to 300 seconds.

The method can further include forming a pixel defining layer between the forming of the first electrode and the forming of the electron injection layer, wherein the pixel defining layer is formed on the first electrode and comprises an opening corresponding to the first electrode, wherein the plasma treatment is performed between the forming of the pixel defining layer and the forming of the electron injection layer, and the electron injection layer is formed in the opening so as not to deviate from the opening.

Ultra violet (UV) treatment can be performed between the forming of the first electrode and the forming of the electron injection layer.

The UV treatment can be performed under a normal pressure.

The UV treatment can include ozone.

The UV treatment can be performed for 10 to 60 seconds.

The method can further include forming a pixel defining layer between the forming of the first electrode and the forming of the electron injection layer, wherein the pixel defining layer is formed on the first electrode and comprises an opening corresponding to the first electrode, wherein the UV treatment is performed between the forming of the pixel defining layer and the forming of the electron injection layer, and the electron injection layer is formed in the opening so as not to deviate from the opening.

The forming of the first electrode can be performed using ITO.

BRIEF DESCRIPTION OF THE DRAWINGS

The above and other features and advantages of the present invention will become more apparent by describing in detail certain embodiments thereof with reference to the attached drawings in which.

DETAILED DESCRIPTION OF CERTAIN INVENTIVE EMBODIMENTS

Certain embodiments will be described in detail with reference to the accompanying drawings.

Figure 1:
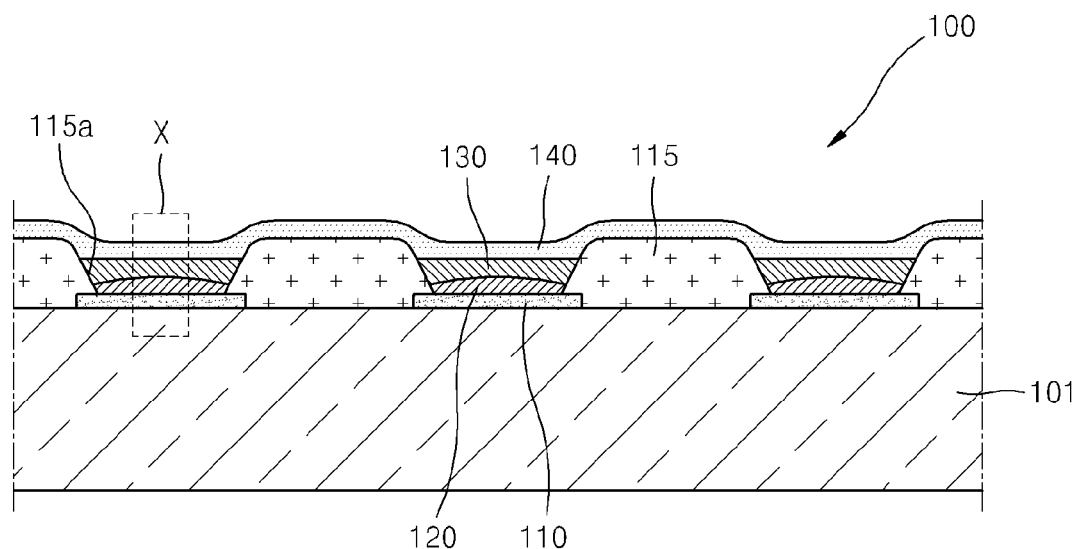
FIG. 1 is a schematic cross-sectional view illustrating an embodiment of an organic light-emitting apparatus.
Figure 2:
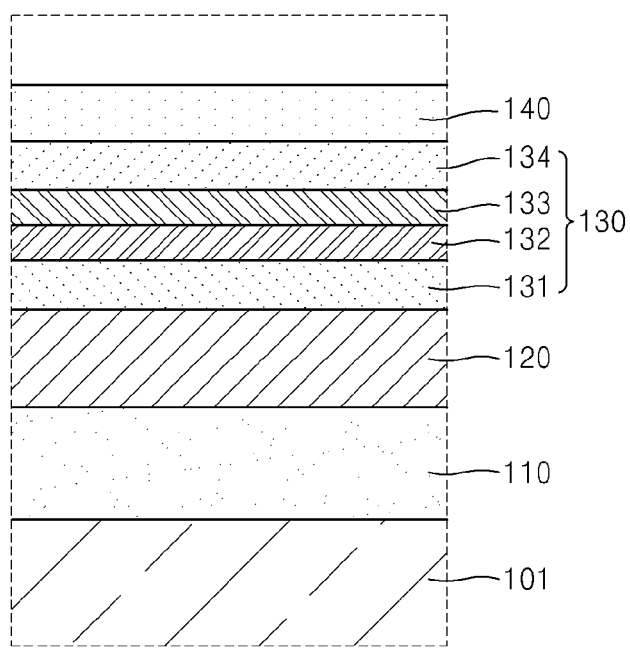
FIG. 2 is an enlarged view of region X illustrated in FIG. 1.
Figure 3:
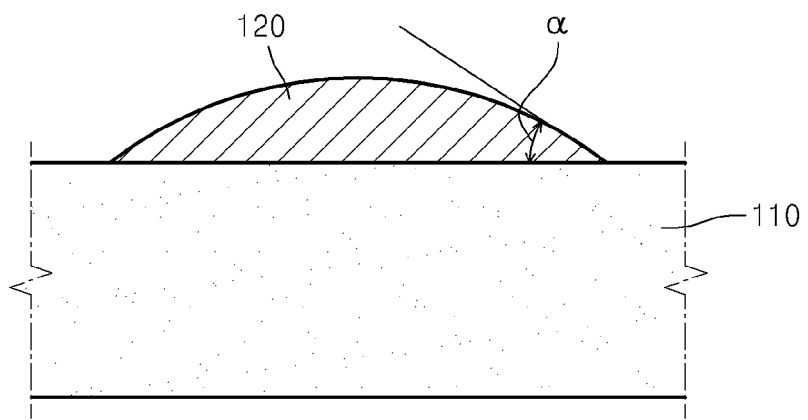
FIG. 3 is a schematic view of a contact angle between a first electrode and an electron injection layer illustrated in FIG. 1.

FIG. 1 is a schematic cross-sectional view illustrating an embodiment of an organic light-emitting apparatus 100.

Referring to FIG. 1, the organic light-emitting apparatus 100 includes a substrate 101, a first electrode 110, an electron injection layer 120, an intermediate layer 130, and a second electrode 140.

The substrate 101 can be formed of a $SiO_2$-based transparent glass material, but is not limited thereto and can be formed of any transparent plastic material. The transparent plastic material can be an insulating organic material, for example, at least one material selected from the group consisting of polyethersulphone (PES), polyacrylate (PAR), polyetherimide (PEI), polyethyelenen napthalate (PEN), polyethyeleneterepthalate (PET), polycontact angle αene sulfide (PPS), polyallylate, polyimide, polycarbonate (PC), cellulose triacetate (TAC), and cellulose acetate propionate (CAP).

The substrate 101 can be formed of a metal, or it can be in the form of foil.

The first electrode 110 is disposed on the substrate 101. The first electrode 110 can be formed with a predetermined pattern by using a photolithography method. A buffer layer (not shown) may be formed between the substrate 101 and the first electrode 110 so as to provide a flat surface on the substrate 101 and to prevent impurities from penetrating the substrate 101. The buffer layer can be formed of $SiO_2$ and/or SiNx.

The pattern of the first electrode 110 can be formed of a plurality of stripe lines that are spaced apart from one another at a predetermined interval. Some embodiments of the organic light-emitting apparatus 100 can be a passive matrix (PM)-type organic light-emitting apparatus. An active matrix type (AM) organic light-emitting apparatus is described below.

The first electrode 110 functions as a cathode, and includes indium tin oxide (ITO).

A pixel defining layer 115 is disposed on the first electrode 110. The pixel defining layer 115 includes an opening 115a corresponding to the first electrode 110. The pixel defining layer 115 covers edges of the first electrode 110, and the opening 115a overlaps with a predetermined region of an upper surface of the first electrode 110. The pixel defining layer 115 can be formed of any of various insulating materials and can include a high molecular material. The pixel defining layer 115 can include a polyimide-based high molecular material.

The electron injection layer 120 is disposed on the first electrode 110 to contact the upper surface of the first electrode 110. The electron injection layer 120 is disposed in the opening 115a so as not to deviate from the opening 115a of the pixel defining layer 115 and contacts the upper surface of the first electrode 110. The electron injection layer 120 includes magnesium (Mg) so as to improve an electron injection characteristic into the intermediate layer 130.

The electron injection layer 120 is disposed to have a contact angle α between about 10° and about 70° when contacting the first electrode 110.

When the contact angle α between the electron injection layer 120 and the first electrode 110 is less than about 10°, the electron injection layer 120 may be formed not only in the opening 115a of the pixel defining layer 115, but also in the entire area of the pixel defining layer 115. One opening 115a of the plurality of openings 115a illustrated in FIG. 1 may correspond to one sub-pixel. When the contact angle α between the electron injection layer 120 and the first electrode 110 is less than about 10°, the electron injection layer 120 may be formed to extend across all the openings 115a.

In such a case, there may be a problem in that all sub-pixels (not shown) are short-circuited due to the electron injection layer 120. Accordingly, it is preferable that the contact angle α between the electron injection layer 120 and the first electrode 110 is equal to or greater than about 10°.

When the contact angle α between the electron injection layer 120 and the first electrode 110 is greater than about 70°, a contact characteristic of a contact surface between the electron injection layer 120 and the first electrode 110, and a contact characteristic of a contact surface between the intermediate layer 130 and the electron injection layer 120 are decreased. Thus, an electric field is not properly applied to the intermediate layer 130, and in particular, to the organic emission layer of the intermediate layer 130, and consequently, an electrical characteristic and image quality of the organic light-emitting apparatus 100 are decreased. Accordingly, the contact angle α between the electron injection layer 120 and the first electrode 110 is equal to or less than about 70°.

The intermediate layer 130 is disposed on the electron injection layer 120. The intermediate layer 130 includes at least an organic emission layer 132. The intermediate layer 130 also includes an electron transport layer 131, a hole transport layer 133, and a hole injection layer 134.

The organic emission layer 132 can emit visible light having various colors, such as for example, red, green, and blue.

When the organic emission layer 132 emits red visible light, the organic emission layer 132 can include tetraphenyl naphthacene (Rubrene), tris(1-phenylisoquinoline)iridium (III) ($Ir(piq)_3$), bis(2-benzo [b]thiophene-2-yl-pyridine) (acetylacetonate)iridium(III) ($Ir(btp)_2(acac)$), tris(dibenzoylmethane)phenathroline europium(III) ($Eu(dbm)_3(phen)$), tris[4,4'-di-tert-buthyl-(2,2')-bipyridine]ruthenium(III) complex ($Ru(dtb-bpy)_3*2(PF_6)$), DCM1, DCM2, Eu(thenoyltrifluoroacetone)3 (Eu(TTA)3), butyl-6-(1,1,7,7-tetramethyljulolidyl-9-enyl)-4H-pyran (DCJTB), and the like, and can also include a polymer emission material such as a polyfluorene-based polymer or a polyvinyl-based polymer.

When the organic emission layer 132 emits green visible light, the organic emission layer 132 can include 3-(2-benzothiazolyl)-7-(diethylamino)coumarin (Coumarin 6) 2,3,6,7-tetrahydro-1,1,7,7,-tetramethyl-1H, 5H, 11H-10-(2-benzothiazolyl)quinolidino-[9,9a,1gh]coumarin (C545T), N,N'-dimethyl-quinacridone (DMQA), tris(2-phenylpyridine)iridium(III) ($Ir(ppy)_3$), and the like, that are green luminescent materials, and can also include a polymer emission material such as a polyfluorene-based polymer or a polyvinyl-based polymer.

When the organic emission layer 132 emits blue visible light, organic emission layer 132 can include oxadiazole dimer dyes (Bis-DAPDXP), spiro compounds (Spiro-DPVBi, Spiro-6P), triarylamine compounds, bis(styryl) amine (DPVBi, DSA), 4,4'-bis(9-ethyl-3-carbazovinylene)-1,1'-biphenyl (BCzVBi), perylene, 2,5,8,11-tetra-tert-buthylperylene (TPBe), 9H-carbazole-3,3'-(1,4-phenylene-di-2,1-ethene-diyl)bis[9-ethyl-(9C)] (BCzVB), 4,4-bis[4-(di-p-tolylamino)styryl]biphenyl (DPAVBi), 4-(di-p-tolylamino)-4'-[(di-p-tolylamino)styryl]stilbene (DPAVB), 4,4'-bis[4-(diphenylamino)styryl]biphenyl (BDAVBi), bis(3,5-difluoro-2-(2-pyridyl)phenyl-(2-carboxypyridyl)iridium III (FIrPic), and the like, that are blue luminescent materials, and can also include a polymer emission material such as a polyfluorene-based polymer or a polyvinyl-based polymer.

Other embodiments of the organic emission layer 132 can be formed of any of various materials.

The electron transport layer 131 is disposed on the electron injection layer 120, the organic emission layer 132 is disposed on the electron transport layer 131, the hole transport layer 133 is disposed on the organic emission layer 132, and the hole injection layer 134 is disposed on the hole transport layer 133.

In other embodiments, the intermediate layer 130 may include one or two of the electron transport layer 131, the hole transport layer 133, and the hole injection layer 134 instead of including all of them. In yet other embodiments, the intermediate layer 130 may include only the organic emission layer 132.

The second electrode 140 is disposed on the intermediate layer 130. The second electrode 140 functions as an anode. When the organic light-emitting apparatus 100 is a PM-type organic light-emitting apparatus, the second electrode 140 can be in the form of stripe crossing the pattern of the first electrode 110 at right angles.

The second electrode 140 can be a reflective electrode or a transmissive electrode. When the second electrode 140 is a reflective electrode, the second electrode 140 is formed by forming a reflective layer including silver (Ag), Mg, aluminum (Al), platinum (Pt), palladium (Pd), gold (Au), nickel (Ni), neodymium (Nd), iridium (Ir), chromium (Cr), lithium (Li), calcium (Ca), or a combination thereof and disposing ITO, indium zinc oxide (IZO), zinc oxide (ZnO), or $In_2O_3$ having a high work function thereon.

When the second electrode 140 is a transmissive electrode, the second electrode 140 is formed of ITO, IZO, ZnO, or $In_2O_3$ having a high work function.

A sealing member (not shown) may be disposed on the second electrode 140 so as to be opposite to a surface of the substrate 101. The sealing member (not shown) can be formed to protect the intermediate layer 130 against external moisture or oxygen and can be formed of glass or plastic, or alternatively, of a plurality of stacked structures each including an organic material and an inorganic material.

In some embodiments, the organic light-emitting apparatus 100 includes the electron injection layer 120 including Mg and thus can easily implement an inverted type having an improved electron injection characteristic. In particular, when the first electrode 110 is a cathode including ITO having a relatively high work function, an electron injection characteristic can be decreased. However, since the electron injection layer 120 including Mg is formed to contact the first electrode 110, an electron injection characteristic into the intermediate layer 130 through the first electrode 110 is not decreased.

Also, the contact angle α between the electron injection layer 120 and the first electrode 110 can be in the range of about 10° to about 70°, so that a short circuit of sub-pixels due to the electron injection layer 120 may be prevented and image quality of the organic light-emitting apparatus 100 may be improved by increasing a contact characteristic of a contact surface between the electron injection layer 120 and the first electrode 110 and a contact characteristic of a contact surface between the intermediate layer 130 and the electron injection layer 120.

Figure 4:
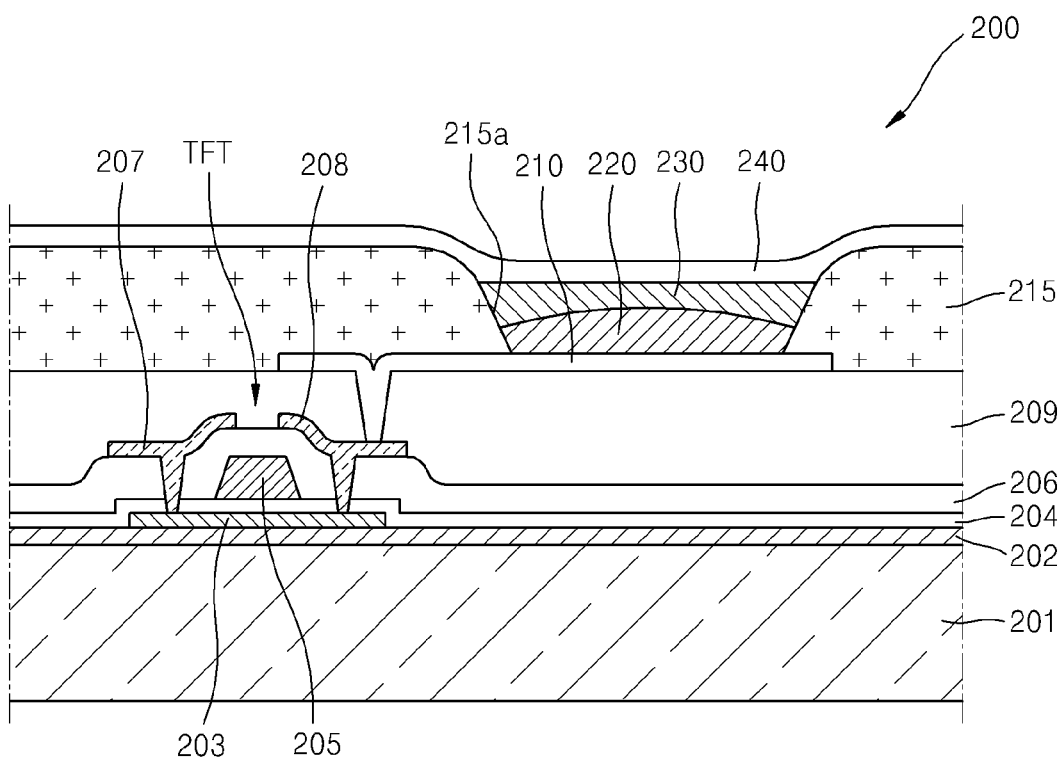
FIG. 4 is a schematic cross-sectional view illustrating another embodiment of an organic light-emitting apparatus.

FIG. 4 is a schematic cross-sectional view illustrating another embodiment of an organic light-emitting apparatus.

Referring to FIG. 4, an organic light-emitting apparatus 200 includes a substrate 201, a thin film transistor (TFT), a first electrode 210, an electron injection layer 220, an intermediate layer 230, and a second electrode 240. The TFT includes an active layer 203, a gate electrode 205, a source electrode 207, and a drain electrode 208.

Hereinafter, components of each member will be described in detail.

A buffer layer 202 is formed on the substrate 201. The buffer layer 202 can include $SiO_2$ or $SiN_X$. The buffer layer 202 can also have a structure in which a plurality of layers are stacked. The buffer layer 202 provides a flat surface on the substrate 201 and prevents moisture or foreign substances from penetrating the substrate 201.

The active layer 203 having a predetermined pattern is formed on the buffer layer 202. The buffer layer 202 can be formed of an organic or inorganic semiconductor such as an amorphous or polycrystalline silicon material, and includes source, drain, and channel regions. The gate insulating layer 204 is formed on the active layer 203. The gate insulating layer 204 can include any of various insulating materials.

The gate electrode 205 is formed on a predetermined area of the gate insulating layer 204. The gate electrode 205 is connected to a gate line (not shown) through which an ON/OFF signal is applied to the TFT. The gate electrode 205 can be formed of a metal such as Au, Ag, Cu, Ni, Pt, Pd, Al, or Mo or an alloy such as Al:Nd or Mo:W, but the present invention is not limited thereto.

An insulating interlayer 206 is formed on the gate electrode 205 so as to expose the source and drain regions of the active layer 203. The source electrode 207 and the drain electrode 208 can be formed to respectively contact the exposed source and drain regions of the active layer 203.

A passivation layer 209 is formed to cover the TFT.

The first electrode 210 is formed on the passivation layer 209. The passivation layer 209 is formed to expose the drain electrode 208, and the first electrode 210 is connected to the exposed drain electrode 208.

The first electrode 210 is a cathode and can include ITO.

A pixel defining layer 215 is formed on the first electrode 210. The pixel defining layer 215 includes any of various insulating materials and also includes an opening 215a. The opening 215a is formed to correspond to the first electrode 210. That is, the opening 215a is formed to overlap with a predetermined area of an upper surface of the first electrode 210.

The electron injection layer 220 is disposed on the first electrode 210. The electron injection layer 220 is disposed in the opening 215a so as not to deviate from the opening 215a of the pixel defining layer 215 and contacts the upper surface of the first electrode 210. The electron injection layer 220 includes Mg so as to improve an electron injection characteristic into the intermediate layer 230.

Also, the electron injection layer 220 is disposed to have a contact angle between about 10° and about 70° when contacting the first electrode 210.

The intermediate layer 230 is disposed on the electron injection layer 220. The intermediate layer 230 includes at least an organic emission layer (not shown). Also, similar to the above-described embodiment, the intermediate layer 230 can include at least one of an electron transport layer, a hole transport layer, and a hole injection layer, or can include none of these layers.

The second electrode 240 is disposed on the intermediate layer 230. The second electrode 240 functions as an anode. The second electrode 240 can be commonly formed across all the sub-pixels (not shown) without having an additional pattern.

When a voltage is applied through the first electrode 210 and the second electrode 240, visible light is emitted from the organic emission layer of the intermediate layer 230.

A sealing member (not shown) can be disposed on the second electrode 240. The sealing member (not shown) can be formed to protect the intermediate layer 230 and other layers against external moisture or oxygen and can be formed of glass or plastic, or alternatively, can be formed of a plurality of stacked structures each including an organic material and an inorganic material.

FIGS. 5A through 5E are cross-sectional views sequentially illustrating an embodiment of a method of manufacturing an organic light-emitting apparatus.

Figure 5A:
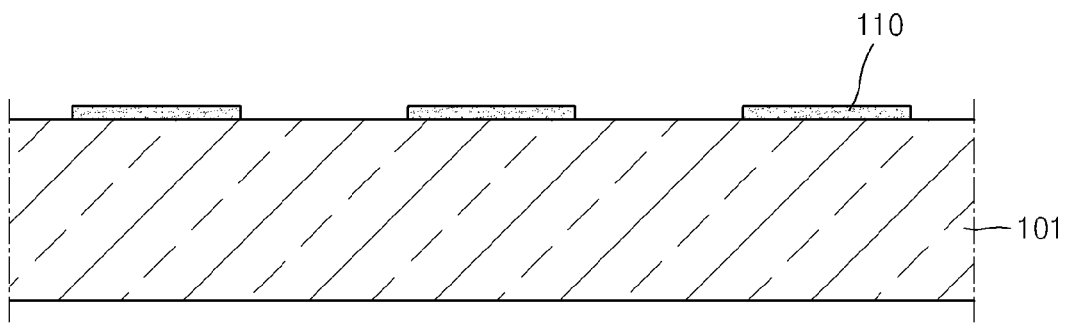
FIGS. 5A through 5E are cross-sectional views sequentially illustrating an embodiment of a method of manufacturing an organic light-emitting apparatus.

Referring to FIG. 5A, the first electrode 110 is formed on the substrate 101. The first electrode 110 can be formed with a predetermined pattern by using a photolithography method. A buffer layer (not shown) can be formed before forming the first electrode 110 on the substrate 101.

The first electrode 110 can be formed of a conductive material, such as, for example, ITO.

Figure 5B:
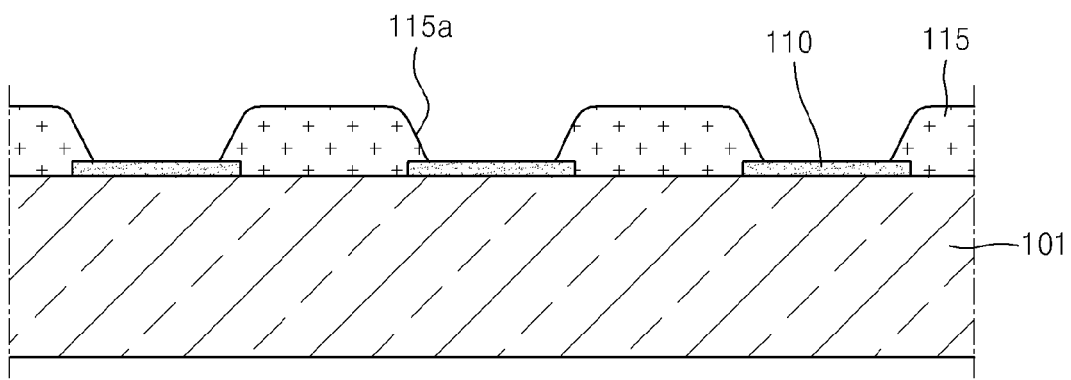

Referring to FIG. 5B, the pixel defining layer 115 is formed on the first electrode 110. The pixel defining layer 115 is formed to include the opening 115a formed with a predetermined pattern. The pixel defining layer 115 can include a high molecular material, such as, for example, polyimide.

The opening 115a is formed to correspond to the first electrode 110. The pixel defining layer 115 is formed to cover edges of the first electrode 110, and the opening 115a is formed to expose a predetermined area of the upper surface of the first electrode 110.

Figure 5C:
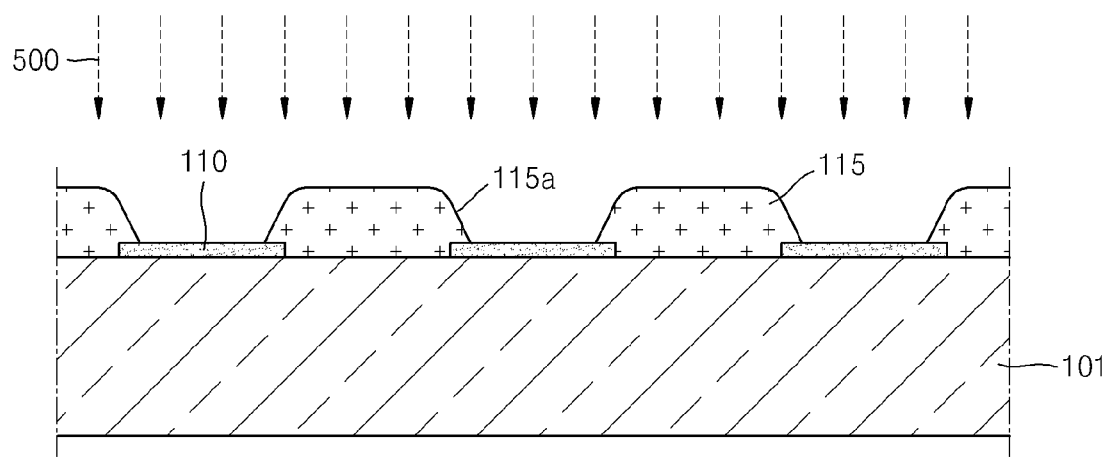

Referring to FIG. 5C, the exposed surface of the first electrode 110 and a surface of the pixel defining layer 115 are treated by using a surface treating material 500.

In some embodiments, the surface treating material 500 can be plasma. A surface treatment process using plasma uses oxygen or nitrogen.

Such a plasma treatment process is performed under a pressure of about 30 mmTorr to about 100 mmTorr, and a power atmosphere of about 200 W to about 1000 W. The plasma treatment process may be performed for about 30 to about 300 seconds.

The contact angle between the electron injection layer 120 and the first electrode 110, which are to be formed through the plasma surface treatment in a subsequent process, can be controlled as desired. The contact angle between the electron injection layer 120 and the first electrode 110 may be controlled to be within the range of about 10° to about 70° through the plasma treatment.

In other embodiments, the surface treating material 500 may be ultra violet (UV). A surface treatment process using UV can be performed by injecting ozone together with UV, and ozone of more than about 10% can be included. Such a UV surface treatment process is performed under a normal pressure. The UV used as the surface treating material 500 can have a wavelength of about 185 nm or about 254 nm.

The UV surface treatment process can be performed for about 10 to about 60 seconds.

The contact angle between the electron injection layer 120 and the first electrode 110, which are to be formed in a subsequent process, can be controlled as desired through the UV surface treatment. The contact angle between the electron injection layer 120 and the first electrode 110 can be controlled to be within the range of about 10° to about 70° through the UV surface treatment.

Figure 5D:
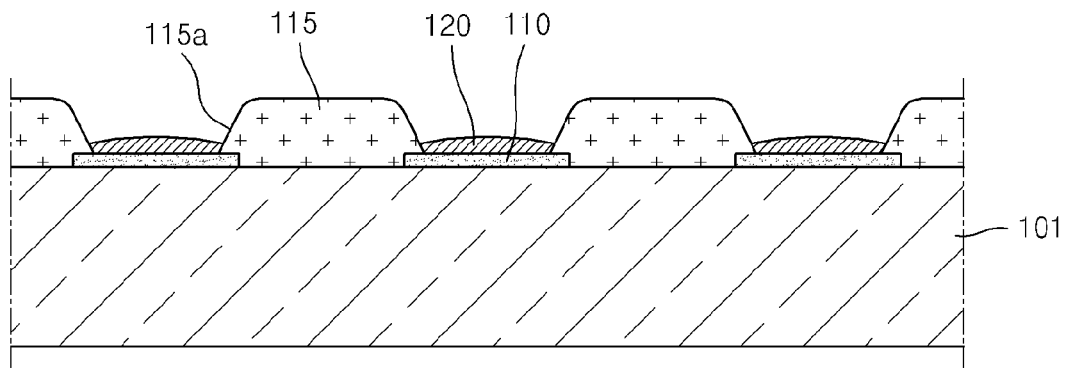

Referring to FIG. 5D, the electron injection layer 120 is formed. The electron injection layer 120 is formed to contact the upper surface of the first electrode 110. The electron injection layer 120 is disposed in the opening 115a so as not to deviate from the opening 115a of the pixel defining layer 115 and contacts the upper surface of the first electrode 110.

An additional mask is not used to form the electron injection layer 120. When the electron injection layer 120 is formed to have a pattern corresponding to that of the opening 115a, a photolithography process is not necessary.

As described above with reference to FIG. 5C, surface characteristics of the pixel defining layer 115 and the first electrode 110 change through plasma treatment or UV treatment. Thus, a contact characteristic of a contact surface between the electron injection layer 120 including Mg and the pixel defining layer 115 including a high molecular material is decreased. The electron injection layer 120 is formed only in the opening 115a of the pixel defining layer 115 instead of being formed in the entire area of the pixel defining layer 115.

A contact angle between the electron injection layer 120 including Mg and the first electrode 110 is in the range of about 10° to about 70°.

The electron injection layer 120 corresponds to the first electrode 110 formed in the opening 115a instead of corresponding to the entire pixel defining layer 115 by allowing the contact angle between the electron injection layer 120 and the first electrode 110 to be equal to or greater than about 10°. Thus, the electron injection layer 120 can be naturally formed to have a desired pattern without performing a photolithography process using an additional mask.

Also, since the contact angle between the electron injection layer 120 and the first electrode 110 is equal to or less than about 70°, contact characteristics of contact surfaces between the electron injection layer 120 and the first electrode 110 and between the intermediate layer 130 and the electron injection layer 120 are improved.

Figure 5E:
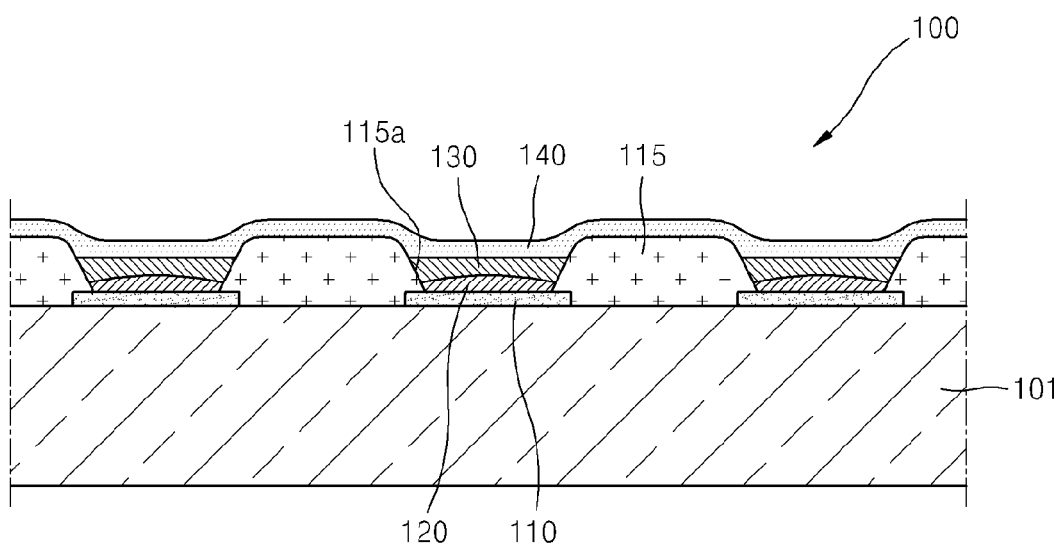

Referring to FIG. 5E, the intermediate layer 130 and the second electrode 140 are formed on the electron injection layer 120, thereby completing manufacture of the organic light-emitting apparatus 100.

The intermediate layer 130 includes at least the organic emission layer 132. The intermediate layer 130 can also include at least one of the electron transport layer 131, the hole transport layer 133, and the hole injection layer 134 or can not include any layer.

The second electrode 140 is disposed on the intermediate layer 130. The second electrode 140 functions as an anode. When the organic light-emitting apparatus 100 is a PM-type organic light-emitting apparatus, the second electrode 140 can be in the form of stripe crossing the pattern of the first electrode 110 at right angles.

A sealing member (not shown) can be disposed on the second electrode 140 so as to be opposite to a surface of the substrate 101.

According to embodiments of the method of manufacturing the organic light-emitting apparatus 100, the organic light-emitting apparatus 100 having an inverted structure and an improved image quality can be easily manufactured. The electron injection layer 120 can include Mg when being formed on the first electrode 110 so as to improve an electron injection characteristic from the first electrode 110 into the intermediate layer 130. In this regard, since the electron injection layer 120 includes a metal, the electron injection layer 120 should be independently formed in each sub-pixel instead of being formed across all the sub-pixels. In some embodiments, the electron injection layer 120 can be patterned through plasma treatment or UV treatment without performing an additional process before forming the electron injection layer 120. The electron injection layer 120 can be formed to have a desired pattern without performing an additional process, for example, a photolithography process.

The organic light-emitting apparatus and the method of manufacturing the organic light-emitting apparatus can easily improve image quality.

While the present invention has been particularly shown and described with reference to certain embodiments thereof, it will be understood by those of ordinary skill in the art that various changes in form and details can be made therein without departing from the spirit and scope of the present invention as defined by the following claims.

What is claimed is:

1. An organic light-emitting apparatus comprising:
   a substrate;
   a first electrode formed on the substrate, wherein the first electrode is a cathode;
   an electron injection layer comprising Mg, wherein the electron injection layer is formed to contact an upper surface of the first electrode, wherein a contact angle between the electron injection layer and the first electrode is in the range of about 10° to about 70°;
   an intermediate layer formed on the electron injection layer, the intermediate layer comprising an organic emission layer; and
   a second electrode formed on the intermediate layer, wherein the second electrode is an anode.

2. The organic light-emitting apparatus of claim 1, wherein the first electrode comprises indium tin oxide (ITO).

3. The organic light-emitting apparatus of claim 1, further comprising a pixel defining layer disposed on the first electrode, the pixel defining layer comprising an opening, wherein the electron injection layer and the first electrode contact each other in the opening.

4. The organic light-emitting apparatus of claim 3, wherein the electron injection layer is disposed in the opening so as not to deviate from the opening.

5. The organic light-emitting apparatus of claim 3, wherein the pixel defining layer comprises a polymer material.

* * * * *